(12) United States Patent
Maeda et al.

(10) Patent No.: US 8,715,793 B2
(45) Date of Patent: *May 6, 2014

(54) CONDUCTIVE LAMINATE AND TOUCH PANEL USING SAME

(71) Applicant: Oji Holdings Corporation, Tokyo (JP)

(72) Inventors: Masayo Maeda, Tokyo (JP); Yohei Nakamura, Tokyo (JP); Junya Kojima, Tokyo (JP); Aiko Gondo, Tokyo (JP)

(73) Assignee: Oji Holdings Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/913,766

(22) Filed: Jun. 10, 2013

(65) Prior Publication Data

US 2013/0270098 A1 Oct. 17, 2013

Related U.S. Application Data

(63) Continuation of application No. 13/576,608, filed as application No. PCT/JP2011/052614 on Feb. 8, 2011.

(30) Foreign Application Priority Data

Feb. 9, 2010 (JP) .................................. 2010-026732

(51) Int. Cl.
*H05K 1/09* (2006.01)
(52) U.S. Cl.
USPC ......... 428/1.4; 428/1.54; 345/174; 174/126.1
(58) Field of Classification Search
USPC ............................. 428/1.4–1.5, 1.54, 355 AC; 345/173–174; 174/126.1; 349/122
See application file for complete search history.

(56) References Cited

U.S. PATENT DOCUMENTS

| 5,731,050 | A | 3/1998 | Kotsubo et al. |
| 7,230,316 | B2 | 6/2007 | Yamazaki et al. |
| 2003/0118941 | A1 | 6/2003 | Hayakawa et al. |
| 2004/0119701 | A1 | 6/2004 | Mulligan et al. |
| 2005/0073507 | A1 | 4/2005 | Richter et al. |
| 2005/0126831 | A1 | 6/2005 | Richter et al. |
| 2007/0141288 | A1 | 6/2007 | Hongo et al. |
| 2007/0210702 | A1 | 9/2007 | Nakamura |

(Continued)

FOREIGN PATENT DOCUMENTS

| CN | 1432029 A | 7/2003 |
| CN | 1754141 A | 3/2006 |

(Continued)

OTHER PUBLICATIONS

Office Action issued on Dec. 6, 2012 for U.S. Appl. No. 13/576,608.

(Continued)

*Primary Examiner* — Sophie Hon
(74) *Attorney, Agent, or Firm* — Knobbe Martens Olson & Bear LLP

(57) ABSTRACT

A touch panel that not only demonstrates little deterioration of performance even in harsh environments at high temperature and high humidity, but is also free of the occurrence of a whitening phenomenon occurring during sudden changes in temperature and humidity, while also having superior shock resistance. A conductive laminate in which a uniform or arbitrarily patterned conductive layer containing a polythiophene-based conductive agent and an adhesive layer containing an acidic component are in direct contact over the entire surface or a portion thereof, and a touch panel in which it is used.

7 Claims, 2 Drawing Sheets

(56) References Cited

U.S. PATENT DOCUMENTS

| | | |
|---|---|---|
| 2009/0091548 A1 | 4/2009 | Fujii et al. |
| 2010/0136276 A1 | 6/2010 | Andou et al. |
| 2010/0315710 A1 | 12/2010 | Sugino et al. |
| 2011/0050623 A1 | 3/2011 | Lee et al. |
| 2011/0084602 A1 | 4/2011 | Saito et al. |
| 2011/0109564 A1 | 5/2011 | Lee et al. |
| 2011/0310053 A1 | 12/2011 | Kim et al. |

FOREIGN PATENT DOCUMENTS

| | | |
|---|---|---|
| CN | 1864124 A | 11/2006 |
| CN | 1918538 A | 2/2007 |
| CN | 101408818 A | 4/2009 |
| JP | A-2006-169455 | 6/2006 |
| JP | A-2007-052975 | 3/2007 |
| JP | A-2007-152869 | 6/2007 |
| JP | A-2007-328092 | 12/2007 |
| JP | A-2008-203861 | 9/2008 |
| JP | A-2009-079203 | 4/2009 |
| JP | A-2006-166243 | 7/2009 |
| JP | A-2009-166243 | 7/2009 |
| JP | A-2009-211847 | 9/2009 |
| JP | A-2010-015507 | 1/2010 |
| WO | WO 2004/061808 A2 | 7/2004 |
| WO | WO 2005/041011 A2 | 5/2005 |
| WO | WO 2005/062466 A2 | 7/2005 |

OTHER PUBLICATIONS

Office Action issued on Mar. 18, 2013 for U.S. Appl. No. 13/576,608.
Notice of Allowance issued on Jun. 24, 2013 for U.S. Appl. No. 13/576,608.
International Search Report issued in corresponding International Patent Application No. PCT/JP2011/052614 on Mar. 29, 2011.
Office Action issued in Japanese Patent Application No. 2011-553842 on May 8, 2012.
Derwent Abstract of WO 20110 99474, Gondo et al, Aug. 18, 2011.
Office Action issued on Jun. 21, 2013 in Chinese Patent Application No. 201180008934.4.

CONDUCTIVE LAMINATE AND TOUCH PANEL USING SAME

RELATED APPLICATIONS

This application is a continuation of U.S. patent application Ser. No. 13/576,608, filed Aug. 1, 2012, which is the U.S. National Phase under 35 U.S.C. §371 of International Application No. PCT/JP2011/052614, filed Feb. 8, 2011, designating the U.S., and published in Japanese as WO 2011/099474 on Aug. 18, 2011, which claims priority to Japanese Patent Application No. 2010-026732, filed Feb. 9, 2010, the content of which is incorporated herein by reference in its entirety.

TECHNICAL FIELD

The present invention relates to a conductive laminate suitable for use as a constituent member of a touch panel that not only has low performance variation in harsh environments such as high-temperature, high-humidity environments, but also does not exhibit a whitening phenomenon occurring during sudden changes in temperature or humidity, while also having superior shock resistance.

BACKGROUND ART

Touch panels are electronic components that function as location input devices, and are used in a wide range of applications such as cell phones or portable game devices by combining with a display device in the manner of a liquid crystal panel. A touch panel is an interface capable of performing a suitable operation desired by an operator by sensing information relating to a specific location when the operator points to that specific location on the touch panel with a finger or input pen based on a screen display.

Although touch panels employ methods based on various principles to detect a pointed location, a detection method employing a resistive film has been widely used thus far. The resistive film detection method involves detecting a location based on a voltage between two opposing transparent, conductive films. When a voltage is applied to one of the two films, a voltage corresponding to a location of the transparent conductive film that has been operated is generated in the other transparent conductive film. The location that has been operated can be specified by detecting that voltage.

On the other hand, in addition to touch panels being highly accurate, highly durable and highly sensitive, following the development of multi-touch systems in recent years, the use of electrostatic capacitive touch panels has rapidly proliferated primarily in mobile devices such as cell phones. With the growth of devices in which these touch panels are installed and the environment in which they are used, along with increasing diversification of the types of these touch panels that are available, these touch panels are expected to surpass the number of resistive film types in the future.

Two examples of typical detection methods employed by electrostatic capacitive touch panels include analog detection surface types and projective types employing an integrating detection system using patterned electrodes. Moreover, although numerous proposals have been made for each system and manufacturer for the configuration of projective types, many projective types that have recently demonstrated a sudden increase in popularity impart durability by using a glass or resin plate for the protective plate of the insulating layer interposed between conductive layers or the surface. In the future, the use of various types of resin film films for these components is expected to result in a growing trend towards reduced costs and increased flexibility.

Since the conductive layer serving as a critical component of touch panels is intended to demonstrate both conductive performance and transparency, an ITO (indium tin oxide) layer formed by a dry method such as sputtering or vapor deposition is used most commonly.

However, since dry ITO layers are comparatively brittle and have low shock resistance due to their production method and components, there is the risk of damage due to impacts resulting from dropping and the like. Moreover, since they are also susceptible to bending, when a film is used to make the structural materials of a touch panel flexible, there is the risk of considerable decrease in durability. Therefore, studies have been conducted on the use of a conductive layer formed by a wet method that is capable of improving shock resistance and bendability.

Although there are various types of materials used for conductive layers capable of being formed by a wet method, including metal oxide-based materials such as ITO or ATO, metal-based materials such as silver or copper, and conductive carbon nanofibers, if the emphasis is placed on bendability, then organic conductive polymers are preferable.

In particular, numerous studies are being conducted on polythiophene-based since they are capable of realizing both electrical conductivity and transparency. However, since these polymers are prepared in the form of an aqueous dispersion, there are concerns over wetting following deposition as well as decreases in quality when used in high-humidity environments. Therefore, Patent Document 1 proposes the formation of a protective layer by thermal bonding a transparent insulating sheet to a conductive layer composed of a conductive polymer.

In addition, in the case of touch panels, there are many cases in which conductive layers are used as members by laminating with an adhesive, and in the case of projective-type, electrostatic capacitive touch panels in particular, this configuration is employed over nearly the entire display screen.

However, in the case of dry ITO layers that were used most commonly in the past, since corrosion of the conductive layer leads to inferior quality when combined with an adhesive containing an acidic component, countermeasures have been proposed and used in finished products consisting of, for example, using an adhesive that does not contain an acidic component as is proposed in Patent Document 2.

PRIOR ART DOCUMENTS

Patent Documents

[Patent Document 1] Japanese Patent Application Laid-Open No. 2007-052975
[Patent Document 2] Japanese Patent Application Laid-Open No. 2009-079203

DISCLOSURE OF THE INVENTION

Problems to be Solved by the Invention

However, even if a protective layer is provided as is proposed in Patent Document 1, it was not possible to adequately achieve stable quality under harsh conditions of high temperature and high humidity. In addition, this technique is also unsuitable since it invites increase thickness and increased costs resulting from an increase in the number of members.

On the other hand, in the case a conductive layer is used by laminating with an adhesive, although the adhesive layer can be expected to function as a protective layer, components flowing out from the adhesive layer have a detrimental effect on the conductive layer. Therefore, even if an adhesive of quality determined in consideration of combining with a conductive layer in the form of an ITO layer is laminated as proposed in Patent Document 2, the increase in resistance of the conductive layer in a high-temperature, high-humidity environment was conversely remarkable in comparison with the case of not laminating an adhesive layer. Moreover, since this laminate has the characteristic of becoming cloudy and white when the environment changes from a high-temperature, high-humidity environment to a temperature and humidity of an ordinary environment, it resulted in impairment of touch panel visibility.

Therefore, an object of the present invention is to allow the obtaining of a conductive layer demonstrating favorable durability even in harsh usage environments while using a polythiophene-based conductive polymer as a conductive layer that has strong shock resistance and bendability and is capable of being compatible with reduced costs. Moreover, an object of the present invention is to overcome the problem of the whitening phenomenon that occurs during sudden changes in temperature or humidity, considered to be one of the shortcomings of conventional ITO.

Means for Solving the Problems

The present invention employs the following configurations to achieve the aforementioned objects.

[1] A conductive laminate including: a uniform or arbitrarily patterned conductive layer, an adhesive layer provided in direct contact over the entire surface or a portion of the conductive layer, and an extracting electrode in contact with both the conductive layer and the adhesive layer, which a portion of the extracting electrode being sandwiched between the conductive layer and the adhesive layer, wherein the conductive layer containing a polythiophene-based conductive agent, the extracting electrode is formed by metal materials, and the adhesive layer containing an acidic component.

[2] A conductive laminate including: a base material, a uniform or arbitrarily patterned conductive layer on the base material, an adhesive layer provided in direct contact over the conductive layer, and an extracting electrode in contact with both the conductive layer and the adhesive layer, which a portion of the extracting electrode being sandwiched between the conductive layer and the adhesive layer, wherein the conductive layer containing a polythiophene-based conductive agent, the extracting electrode is formed by metal materials, and the adhesive layer containing an acidic component.

[3] A conductive laminate including: a first base material, a uniform or arbitrarily patterned conductive layer on the first base material, an adhesive layer provided in direct contact over the conductive layer, an extracting electrode in contact with both the conductive layer and the adhesive layer, which a portion of the extracting electrode being sandwiched between the conductive layer and the adhesive layer, and a second base material provided on the adhesive layer, wherein the conductive layer containing a polythiophene-based conductive agent, the extracting electrode is formed by metal materials, and the adhesive layer containing an acidic component.

[4] A conductive laminate including: an insulating layer, a uniform or arbitrarily patterned conductive layer on the insulating layer, an adhesive layer provided in direct contact over the conductive layer, and an extracting electrode in contact with both the conductive layer and the adhesive layer, which a portion of the extracting electrode being sandwiched between the conductive layer and the adhesive layer, wherein the conductive layer containing a polythiophene-based conductive agent, the extracting electrode is formed by metal materials, and the adhesive layer containing an acidic component.

[5] A conductive laminate including: an insulating layer, first and second conductive layers patterned into a shape having uniaxial regularity are laminated onto both sides of the insulating layer so that the patterns of the conductive layer are mutually perpendicular, a first adhesive layer provided in direct contact over the first conductive layer on the outer side of the first conductive layer, a second adhesive layer provided in direct contact over the second conductive layer on the outer side of the second conductive layer, a first extracting electrode in contact with both the first conductive layer and the first adhesive layer, which a portion of the first extracting electrode being sandwiched between the first conductive layer and the first adhesive layer, a second extracting electrode in contact with both the second conductive layer and the second adhesive layer, which a portion of the second extracting electrode being sandwiched between the second conductive layer and the second adhesive layer, wherein the first and the second conductive layers containing a polythiophene-based conductive agent, the first and the second extracting electrodes are formed by metal materials, and the first and the second adhesive layers containing an acidic component.

[6] The conductive laminate according to any one of [1] to [5], wherein the extracting electrode is formed by a silver paste.

[7] The conductive laminate according to any one of [1] to [5], wherein the adhesive layer contains an acrylic polymer having a carboxyl group or a derivative thereof.

[8] The conductive laminate according to any one of [1] to [5], wherein the adhesive layer contains a copolymer comprising a unit derived from one or both of butyl acrylate or ethylhexyl acrylate and a unit derived from acrylic acid.

[9] The conductive laminate according to any one of [1] to [5], wherein the polythiophene-based conductive agent comprises a polymer of one or both of 3-hexylthiophene or 3,4-ethylenedioxythiophene, or a derivative thereof.

[10] A touch panel provided with the conductive laminate according to any one of [1] to [5].

[11] The touch panel according to [10], which is of the electrostatic capacitive type.

Effects of the Invention

According to the conductive laminate of the present invention, durability in a harsh environment such as high temperature or high humidity, favorable visibility and shock resistance can be imparted to a touch panel.

BEST MODE FOR CARRYING OUT THE INVENTION

The following provides an explanation of embodiments of the conductive laminate of the present invention and a touch panel provided therewith.

The conductive laminate of the present invention has a uniform or arbitrarily patterned conductive layer containing a thiophene-based conductive agent and an adhesive layer containing an acidic component. Here, a "uniform" conductive layer indicates a layer used in analog-type, resistive film-type touch panels, for example, in which the surface that functions as a conductive layer is formed to a uniform thickness. In addition, an "arbitrarily patterned" conductive layer indicates a conductive layer used in projective-type, electrostatic capacitive touch panels, for example, that has a regularly patterned shape formed for the purpose of detecting location, and the conductive layer is either partially formed in advance by various types of printing methods and the like, or a portion of a uniformly preformed conductive layer is formed using wet etching using an etching solution or dry etching using laser light and the like followed by removal in a later step. However, even in the case of a uniform layer, a portion of the conductive layer may be patterned in order to form extracting electrodes and the like corresponding to the configuration of the touch panel.

[Conductive Laminate]

Figure 1:
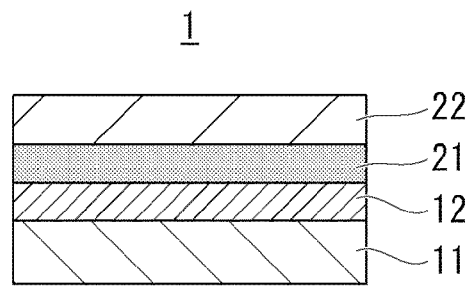
FIG. 1 is a cross-sectional view of a conductive laminate according to an embodiment of the present invention.

The conductive laminate of the present invention comprises a "conductive layer and an adhesive layer facing the conductive layer". Other films or sheet members and the like are laminated on the outsides of both layers corresponding to the application. Although a cross-sectional view of a conductive laminate 1 is shown in FIG. 1 as an embodiment thereof, the configuration is not limited thereto. Furthermore, subsequent cross-sectional views and other drawings mainly indicate the configuration of component members, and are not intended to accurately represent individual dimensions since there are locations where the dimensions and thickness of each member are suitably emphasized.

In FIG. 1, after uniformly coating a coating solution to the base material 11 for a conductive layer, an adhesive layer 21 is adhered to the surface of the conductive layer 12 that has been arbitrarily patterned as necessary, and the opposite side of the adhesive layer is covered with a first releasing base material 22.

(Conductive Layer)

The conductive layer of the conductive laminate of the present invention contains a polythiophene-based conductive agent as a conductive substance. Although polythiophene-based conductive agents are π-conjugated organic conductive polymers that demonstrate electrical conductivity due to the presence of a main chain in which double bonds and single bonds are alternately arranged, since they exhibit low absorbance in the visible light region in particular, they are able to achieve high transparency. In particular, polymers (abbreviated as P3HT) of 3-hexylthiophene (abbreviated as 3HT) and derivatives thereof as well as polymers (abbreviated as PEDOT) of 3,4-ethylenedioxythiophene (abbreviated as EDOT) and derivative thereof are preferable. Moreover, aqueous dispersions (abbreviated as PEDOT-PSS) obtained by polymerizing EDOT in the presence of polystyrene sulfonate (abbreviated as PSS), which not only fulfills the role of a dopant for enhancing electrical conductivity, but also functions as a dispersing agent, as well as PEDOT-PVS, which use polyvinyl sulfonate (PVS) instead of PSS, are more preferable. In addition, self-doped polythiophenes, which have sulfonate groups in the main chain thereof, as well as derivatives of organic solvent-dispersed PEDOT obtained by polymerizing with a flexible polymer such as polyethylene glycol, may also be used corresponding to the combined members, production method and usage conditions.

In addition, high boiling point solvents such as polyethylene glycol, methylformamide, dimethylsulfoxide or N-methylpyrrolidone, which have been confirmed to demonstrate effects that improve electrical conductivity, may also be added as secondary dopants to these PEDOT or derivatives thereof. In this case, the suitable amount of high boiling point solvent added is 10 to 500 parts by weight and more preferably 100 to 300 parts by weight based on 100 parts by weight of the conductive agent. If the amount of high boiling point solvent is excessively low, effects as a secondary dopant are not adequately obtained, while if the amount of high boiling point solvent added is excessively high, the amount of high boiling point solvent that remains in dry coated film increases, thereby resulting in concerns over bleeding (elution) following processing as a laminate and making this undesirable.

Since the aforementioned conductive agent still has inferior depositability when used alone or as a mixture with a dopant, it is preferably mixed with film-forming components such polymerization initiators or crosslinking agents that activate various types of resin components, polymer-forming monomers or oligomers using light or heat to obtain a conductive layer. There are no particular limitations on these so-called binder components, and are suitably prepared according to the physical properties of the conductive layer and type of base material that forms the conductive layer. Examples of resin components include acrylic resin, styrene resin, polyester resin, alkyd resin, urethane resin, amide resin and modified or copolymer resins thereof, while examines of monomers and oligomers include polyester (meth)acrylate, urethane (meth)acrylate and epoxy (meth)acrylate. More specifically, examples of radical polymerization types include, but are not limited to, monofunctional ethyl carbitol (meth)acrylate, phenol ethylene oxide-modified (meth)acrylate, nonylphenol ethylene oxide-modified (meth)acrylate, ethoxy diethylene glycol acrylate, acryloyl morpholine, isobornyl (meth)acrylate and N-vinylpyrrolidone, bifunctional hexanediol di(meth)acrylate, hexanediol ethylene oxide-modified diacrylate, neopentyl glycol polyethylene oxide-modified di(meth)acrylate, tetraethylene glycol di(meth)acrylate, tripropylene glycol di(meth)acrylate, dipropylene glycol di(meth)acrylate, bisphenol A ethylene oxide-modified di(meth)acrylate and polyethylene glycol di(meth)acrylate, and trifunctional or more highly functional trimethylolpropane tri(meth)acrylate, trimethylolpropane ethylene oxide-modified tri(meth)acrylate, glycerin propoxy tri(meth)acrylate, dipentaerythritol hexaacrylate and ditrimethylolpropane tetraacrylate, while examples of cationic polymerization types include, but are not limited to, epoxy compounds such as glycidyl ether compounds or alicyclic epoxy compounds, oxetane compounds and vinyl ether compounds. In particular, polyester-based resins can be used preferably.

In addition, a component that imparts solvent resistance to the conductive layer, such as a crosslinking agent or other monofunctional component, is preferably mixed with the conductive agent as a film-forming component. Although there are no particular limitations on the type thereof, examples thereof include the aforementioned trifunctional or more highly functional monomers and oligomers, organosilanes such as silane coupling agents, and epoxy-based, isocyanate-based or melamine-based crosslinking agents. In particular, silane coupling agents, which have an organic functional group and an alkoxyl group in a molecule thereof, can be used preferably since they contribute to improved sealability of not only the binder component, but also hard coating layers containing an Si component and PET films having a highly adhesive layer. On the other hand, caution is required regarding the use of melamine-based crosslinking agents since they can cause a decrease in transparency of the conductive layer.

The amount of binder component mixed into the conductive layer is preferably the minimal amount for demonstrating maximum conductive performance of the conductive agent. In addition, in the case of requiring patterning of the conductive layer corresponding to the type of touch panel, the use of a photocurable photosensitive binder is preferable since it enables the conductive layer to be patterned by a photomask. Furthermore, in the case of carrying out patterning of the conductive layer by printing, the amount of binder component added (since it has a considerable effect on viscosity) and molecular weight are suitable adjusted in order to adjust to an ink viscosity suitable for various types of printing methods.

In addition to these main components, additives such as antioxidants, heat resistance stabilizers, ultraviolet absorbers, metal corrosion preventers, pH adjusters, organic particles, inorganic particles, pigments, dyes, antistatic agents, nucleating agents or coupling agents, or coating assistants such as wetting agents or antifoaming agents, may be suitably mixed in within a range that does not significantly impair the conductive performance of the conductive agent.

Wetting agents and antifoaming agents are effective for preventing defects in the conductive layer, and although silicone-based, long-chain alkyl-based or fluorine-based surfactants and the like are used, since fluorine-based surfactants require caution since they are susceptible to decreases in sealing durability between the conductive layer and the base material or anchor layer, silicone-based or long-chain alkyl-based surfactants are used preferably. Moreover, in addition to being mixed in as additives, these surface activating components may also be integrated into the binder resin by copolymerization and the like. Incorporating these components to adjust the contact angle of the conductive layer to 50 degrees to 100 degrees and more preferably to 60 degrees to 90 degrees is preferable since a conductive layer free of defects is obtained while maintaining sealing durability between the conductive layer and the lower layer.

In addition, various types of conductive agents capable of being coated by adding to a coating agent may be similarly used in combination within a range that does not impair the performance of the essential component in the form of the polythiophene-based conductive agent. Examples thereof include metal compounds such as silver or copper compounds (including fine particles, wires, pastes and soluble salts), metal oxide fine particles such as those of ATO or ITO, organic conductive polymers such as polyaniline, and conductive carbon nanotubes.

Although the mixing ratio of conductive substances, including these various types of conductive agents, added to a conductive coating material is preferably high as previously described, in consideration of the balance between depositability and other qualities, the mixing ratio is preferably 10% by weight to 90% by weight and more preferably 30% by weight to 70% by weight.

A conductive layer composed of the components described above preferably has high transparency for use in a touch panel and the like. Since the polythiophene-based conductive agent per se is a colored substance, the transparency thereof varies considered according to conductive performance, and although it also fluctuates depending on the transparency of the base material and an optical adjustment layer and the like provided on the surface thereof, total luminous transmittance when in the form of a conductive film is preferably 70% or more and more preferably 88% or more, while haze is preferably 5% or less and more preferably 2% or less.

Since the optimum value of thickness of the conductive layer can not be uniformly defined since it also varies considerably according to the application, type of conductive substance and mixing ratio, it is preferably 0.01 μm to 1 μm and more preferably 0.02 μm to 0.08 μm. If the dry film thickness is less than 0.01 μm, it becomes difficult to ensure uniform conductivity, while if the dry film thickness exceeds 1 μm, there is increased susceptibility to decreases in efficiency and increased costs, thereby making this undesirable.

In order to be used as electrode plates for a touch panel, electrical conductivity of the conductive layer is such that surface resistivity is preferably $10^5$ Ω/sq or less, and surface resistivity of $10^3$ Ω/sq or less is more preferable. This level of surface resistivity can be achieved with the previously described conductive coating material and coating amount.

Extracting electrodes may also be formed corresponding to the conditions of use on the surface of the conductive layer or in a form that enables connection therewith. Although highly conductive silver paste or metal materials such as aluminum or molybdenum are suitable as materials of the extracting electrodes, they are not limited thereto, and a known technique such as sputtering by printing a paste and the like can be suitably used for the formation method thereof.

(Adhesive Layer)

The adhesive layer of the present invention is composed of an adhesive containing an acidic component. Although there are no particular limitations on the components of the adhesive layer, examples of components used include natural rubber-based adhesives, synthetic rubber-based adhesives, acrylic adhesives, urethane-based adhesives and silicone-based adhesives. In addition, solvent-type, emulsion-type or aqueous adhesives may also be used. Among these, acrylic adhesives can be used particularly preferably from the viewpoint of transparency, weather resistance, durability or cost and the like in the case of using in optical applications.

In particular, a polymer containing as a monomer unit thereof ethylhexyl acrylate or butyl acrylate is particularly preferable from the viewpoint of adhesive quality.

Furthermore, although various types of organic acids or inorganic acids may be used without any particular limitations for the acidic component, in consideration of durability, and particularly bleedout after incorporating as a member of a device, an acidic group such as a carboxyl group, phosphate group or sulfonate group is preferably bound to a portion of the polymer serving as the main component of the adhesive. Among these, copolymers containing as a monomer unit thereof acrylic acid containing a carboxyl group, or a derivative thereof, are preferable from the viewpoint of conductive performance as a conductive laminate.

Other assistants may also be added to the adhesive as necessary. Examples of other assistants include ultraviolet absorbers, thickeners, pH adjusters, tackifiers, binder components, crosslinking agents, adhesive fine particles, antifoaming agents and antiseptic anti-mold agents.

Although the optimum thickness of the adhesive layer cannot be uniformly defined since it varies according to the composition thereof, is it preferably 5 µm to 500 µm and more preferably 10 µm to 300 µm. If the thickness is less than 5 µm, the effect of the acidic component contained in the adhesive is not adequately obtained, while if the thickness exceeds 500 µm, in addition to increased susceptibility to deformation, there is concern over impairment of location sensing function when used as a touch panel, thereby making this undesirable.

(Conductive Laminate)

The polythiophene-based conductive agent used as a conductive substance in the present invention is π-conjugated, organic conductive polymer composed of a main chain, in which double bonds and single bonds are alternately arranged, that demonstrates efficient conductivity under acidic conditions. Combining this with the adhesive of the present invention containing an acidic component is presumed to stabilize the π-conjugated system of the conductive layer over a long period of time and thereby improve the durability of electrical conductivity. On the other hand, although adhesives containing an acidic component were considered to be difficult to use in conductive laminates due to corrosion of the ITO widely used for the conductive layer, these adhesives have the characteristic of becoming white in response to changes in the temperature and humidity environment. This whitening phenomenon was particularly problematic since it has a detrimental effect on visibility of a display unit when occurring in the state of a patterned conductive layer incorporated in an image display device. As a result of combining a polythiophene-based conductive layer and adhesive layer containing an acidic component, the conductive laminate of the present invention employs a configuration capable of maximally demonstrating the characteristics of both.

However, if the pH of the base material becomes extremely low, there is the risk of corrosion of peripheral members when incorporating in a touch panel, thereby making this undesirable. Therefore, the surface pH of the conductive layer is preferably 1 to 6 and more preferably 3 to 5. On the other hand, the surface pH of the adhesive layer is preferably 2 to 7 and more preferably 3 to 6. In addition, the difference in pH between the conductive layer and the adhesive layer is preferably 2 or less. Furthermore, a corrosion preventer may be added to the conductive layer and adhesive layer as a countermeasure against corrosion, and examples thereof include 1,2,3-benzotriazole, tolyltriazole and derivatives thereof.

(Base Material)

The conductive layer and the adhesive layer are formed on the surface of various types of base materials in the form of a sheet. The laminated may be used as laminate integrated with the base material after having formed the conductive layer or adhesive layer on the surface of a base material, or the conductive layer or adhesive layer may be formed on the surface of a releasing base material that has been subjected to release treatment in advance followed by peeling off the releasing base material and combining with another base material.

Sheet-like materials such as glass substrates or various types of resin films or plates can be used for the base material. These base materials are selected corresponding to the application. Examples of resins polyethylene terephthalate, polyethylene naphthalate, polypropylene terephthalate, polybutylene terephthalate, polypropylene naphthalate, polyethylene, polypropylene, cellophane, diacetyl cellulose, triacetyl cellulose, cycloolefin polymers, acetyl cellulose butyrate, polyvinyl chloride, polyvinylidene chloride, polyvinyl alcohol, ethylene-vinyl acetate copolymer, polystyrene, polycarbonate, polymethylpentene, polysulfone, polyether ether ketone, polyether sulfone, polyether imide, polyimide, fluorine resin, polyamide, (meth)acrylic resin and copolymers of methyl methacrylate and styrene. In particular, biaxially oriented films of polyethylene terephthalate, glass plates, cycloolefin polymers from the viewpoints of transparency, weather resistance, solvent resistance, rigidity and cost, and polycarbonate sheets having favorable transparency, can be used preferably.

Various types of additives may be contained in these base materials. Examples of additives include antioxidants, heat resistance stabilizers, ultraviolet absorbers, organic particles, inorganic particles, pigments, dyes, antistatic agents, nucleating agents and coupling agents. Although selected corresponding to the required application, these base materials are preferably transparent materials when using as a touch panel.

Furthermore, various types of layers may be provided on the surface of each type of base material corresponding to the application. Examples of such layers include optical adjustment layers such as an interference fringe countermeasure layer or dispersion adjustment layer containing various types of dispersants, and an anchor layer containing an isocyanate or other reactive substance for the purpose of enhancing sealability with the upper layer. In addition, uneven surface treatment such as sandblasting treatment or solvent treatment, or surface oxidation treatment such as corona discharge treatment, chromic acid treatment, flame treatment, hot air treatment or ozone-ultraviolet irradiation treatment may also be carried out. Furthermore, a foam releasing layer may also be provided for patterning the conductive layer that enables separation of only locations on the conductive layer base material that have been irradiated with an active energy beam. In addition, a hard coating layer containing hard components may be provided on the surface of the base material in the case the base material surface is exposed or in order to inhibit superficial abrasions from occurring in the base material during processing.

In the case of providing a hard coating layer, an acrylic polymer can be preferably used for the main component thereof. Acrylic polymers are polymers of monomers or oligomers having polymerizable unsaturated groups.

Polyfunctional (meth)acrylates are preferable as monomers or oligomers of organic compounds having polymerizable unsaturated groups, examples of which include bifunctional (meth)acrylates such as dipropylene glycol di(meth)acrylate, 1,6-hexanediol di(meth)acrylate, tripropylene glycol di(meth)acrylate, polyethylene glycol (weight average molecular weight: 600) di(meth)acrylate, propylene oxide-modified neopentyl glycol di(meth)acrylate, modified bisphenol A di(meth)acrylate, tricyclodecane dimethanol di(meth)acrylate or polyethylene glycol (weight average molecular weight: 400) di(meth)acrylate, trifunctional (meth)acrylates such as pentaerythritol (meth)acrylate, trimethylolpropane tri(meth)acrylate, trimethylolpropane ethoxy tri(meth)acrylate, polyether tri(meth)acrylate or glycerol propoxy tri(meth)acrylate, and tetrafunctional or more highly functional (meth)acrylates such as pentaerythritol tetra(meth)acrylate, pentaerythritol ethoxy tetra(meth)acrylate, ditrimethylolpropane tetra(meth)acrylate, propionic acid-modified dipentaerythritol penta(meth)acrylate, dipentaerythritol monohydroxy penta(meth)acrylate or dipentaerythritol hexa(meth)acrylate. One type of these polyfunctional acrylates may be used alone or two or more types can be used in combination.

Tetrafunctional or more highly functional (meth)acrylates are selected more preferably in order to obtain pencil hardness of the resulting hard coated layer of 3H or higher.

Monomers or oligomers of organic compounds having polymerizable unsaturated groups may be able to be cured by heating or with an active energy beam.

A flexible component may also be contained in the hard coating layer. The containing of a flexible component makes it possible to prevent the formation of cracks when stamping out the conductive laminate.

(Meth)acrylates having one or more polymerizable unsaturated groups in a molecule thereof are used for the flexible component. Examples of the aforementioned (meth)acrylates include bifunctional (meth)acrylates such as tricyclodecane methylol di(meth)acrylate, ethylene oxide-modified di(meth)acrylates of bisphenol F, ethylene oxide-modified di(meth)acrylates of bisphenol A, ethylene oxide-modified di(meth)acrylates of isocyanuric acid, polypropylene glycol di(meth)acrylate or polyethylene glycol di(meth)acrylate, trifunctional (meth)acrylates such as trimethylolpropane tri(meth)acrylate, propylene oxide-modified tri(meth)acrylates of trimethylpropane or ethylene oxide-modified tri(meth)acrylates of trimethylpropane, urethane (meth)acrylates, polyester (meth)acrylates and polyether (meth)acrylates. In particular, trifunctional (meth)acrylates and urethane (meth)acrylates are selected more preferably.

One type of these (meth)acrylates can be used alone or two or more types can be used in combination.

The hard component may contain reactive inorganic oxide particles and/or reactive organic particles. Containing reactive inorganic oxide particles and/or reactive organic particles is particularly preferable since they are able to impart soiling resistance, anti-fingerprint properties, antistatic properties and the like.

Reactive inorganic oxide particles are inorganic oxide particles that have been treated with a coupling agent, while reactive organic particles are organic particles that have been treated with a coupling agent. Treatment of inorganic oxide particles or organic particles with a coupling agent makes it possible to enhance bonding strength with acrylic polymers. As a result, surface hardness and scratch resistance can be improved, and dispersibility of the inorganic oxide particles and organic particles can also be improved.

Here, the inorganic oxide particles preferably have high hardness, and examples of inorganic oxide particles that can be used include silicon dioxide particles, titanium dioxide particles, zirconium oxide particles and aluminum oxide particles.

Examples of organic particles that can be used include resin particles such as those of acrylic resin, polystyrene, polysiloxane, melamine resin, benzoguanamine resin, polytetrafluoroethylene, cellulose acetate, polycarbonate or polyamide.

Examples of coupling agents include γ-aminopropyltriethoxysilane, γ-aminopropyltrimethoxysilane, γ-glycidoxypropyltriethoxysilane, γ-glycidoxypropyltrimethoxysilane, γ-mercaptopropyltrimethoxysilane, γ-aminopropyltriethoxysilane and γ-aminopropyl-triethoxyaluminum. One type of these coupling agents may be used alone or two or more types be used in combination.

The amount of coupling agent used for treatment is preferably 0.1 parts by weight to 20 parts by weight and more preferably 1 part by weight to 10 parts by weight to 100 parts by weight of inorganic oxide particles or organic particles.

In addition, various types of releasing sheets, in which a releasing treatment layer is formed on various types of base materials as previously described or a sheet-like material such as paper with a condensed or addition type silicone-based releasing agent, or olefin-based, long-chain alkyl group-containing polymer-based or fluorine-based non-silicone-based releasing agent, can be used as a releasing base material used as a temporary base material of the adhesive layer. A resin film made of polyester or polypropylene, or a paper sheet, can be used particularly preferable from the viewpoints of physical properties and cost.

(Laminate Preparation Method)

The conductive laminate 1 of the present invention can be manufactured in, for example, the manner described below.

(1) Conductive Layer Formation Step

Figure 2:
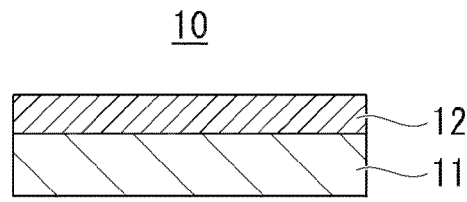
FIG. 2 is a cross-sectional view of a conductive film according to an embodiment of the present invention.

A conductive layer 12 is formed on one side of a first base material 11 to obtain a conductive film 10. In the case the conductive layer 12 requires patterning or extracting electrodes 32, extraction processing may be carried out at this time. A cross-sectional view of an embodiment of the conductive film 10 is shown in FIG. 2. Furthermore, in FIG. 2, the same reference symbols are used to indicate those constituent members that are same as those in FIG. 1, and detailed explanations thereof are omitted. Furthermore, this applies similarly to subsequent drawings as well.

(2) Adhesive Layer Formation Step

Figure 3:
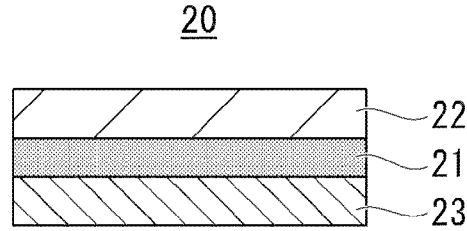
FIG. 3 is a cross-sectional view of an adhesive sheet according to an embodiment of the present invention.

A liquid adhesive is coated onto one side of a first releasing base material 22 and dried to form an adhesive layer 21, and a second releasing base material 23 is affixed to the surface thereof to obtain an adhesive sheet 20. A cross-sectional view of an embodiment of the adhesive sheet 20 is shown in FIG. 3.

(3) Adhesion Step

An adhesive layer surface obtained by peeling off the second releasing base material 23 of the adhesive sheet 20 is adhered to the conductive layer side of the conductive film 10 to obtain the conductive laminate 1.

(4) Cutting or Stamping Step

The conductive laminate 1 is then cut or stamped to process into a desired form.

In the aforementioned conductive layer formation step (1) and the adhesive layer formation step (2), the conductive layer, adhesive layer or layer such as an anchor layer formed as necessary are formed by known means such as coating or printing.

Examples of coating methods include, but are not limited to, blade coating, air knife coating, roll coating, bar coating, gravure coating, microgravure coating, rod and blade coating, lip coating, die coating and curtain coating. Examples of printing methods include, but are not limited to, screen printing, offset printing, flexographic printing, gravure offset printing and inkjet printing.

Microgravure coating is preferable for the conductive layer and anchor layer since the coated amount is comparatively small, while lip coating and die coating can be preferably used for applying to the adhesive layer. In addition, in cases requiring patterning, the conductive layer may be formed only at those locations where required by gravure coating or various types of printing methods, or unnecessary portions of the conductive layer may be removed by a known wet or dry etching method (such as by ablation using laser light) after having formed a uniform conductive layer in advance. In the case of carrying out wet etching, etching treatment may be carried out after masking a portion of the conductive layer by photolithography or screen printing using various types of active energy beams, and an etching solution for organic conductive polymers described in Japanese Patent Application Laid-Open Nos. 2008-091487 or 2008-115310 can be preferably used for this treatment. In addition, etching treatment may also be carried out without masking by directly printing onto a portion of the conductive layer to be removed an etching paste in the manner of Isishape HiperEtch® manufactured by Germany's Merck KGaA.

Furthermore, the active components of each layer may be diluted with various types of solvents in order to prepare a solvent or ink optimal for layer formation. Examples of solvents include water, methanol, ethanol, isopropanol, acetone, methyl ethyl ketone, toluene, n-hexane, n-butyl alcohol, methyl isobutyl ketone, methyl butyl ketone, ethyl butyl ketone, cyclohexanone, ethyl acetate, butyl acetate, propylene glycol monomethyl ether acetate, ethylene glycol monoethyl ether, propylene glycol monomethyl ether and N-methyl-2-pyrrolidone. One type of these solvents may be used alone or two or more types may be used as a mixture. Solvents having different evaporation rates are used preferably in order to reduce coating unevenness. For example, mixtures of methyl ethyl ketone, methyl isobutyl ketone, ethyl acetate, butyl acetate and propylene glycol monomethyl ether are used preferably.

In addition, in order to enhance durability of the coating layer obtained after drying, components may be added that accelerate curing of the coating liquid or ink used to form each layer. In the case of using a heat-curable crosslinking agent such as an isocyanate compound or epoxy compound, crosslinking of the coated film may be accelerated and coated film strength may be improved by carrying out heat treatment when drying the coated film or in a chamber using a heating oven or infrared lamp.

On the other hand, in the case of having added a known photopolymerization initiator or photosensitive resin and the like, the molecular weight of the coated film may be increased or the coated film strength may be improved by accelerating the crosslinking reaction by irradiating with an active energy beam.

Examples of active energy beams include ultraviolet light and an electron beam, and ultraviolet light is particularly preferable from the viewpoint of versatility. Examples of light sources of ultraviolet light that can be used include high-pressure mercury lamps, low-pressure mercury lamps, ultra-high-pressure mercury lamps, metal halide lamps, carbon arc lamps, xenon lamps and electrode-less ultraviolet lamps.

Examples of electron beams that can be used include electron beams radiated from various types of electron accelerators such as a Cockcroft-Walton accelerator, Van de Graff accelerator, resonance transformer accelerator, insulated core transformer accelerator, linear accelerator, dynamitron accelerator or high-frequency accelerator.

Curing by irradiating with an active energy beam is preferably carried out in the presence of an inert gas such as nitrogen in order to avoid inhibition of curing caused by oxygen in the atmosphere, and nitrogen gas can be used preferably from the viewpoint of cost.

In addition, the active energy beam irradiation step may be carried out by dividing into two stages consisting of a preliminary curing step and a final curing step.

Formation of the conductive laminate 1 may also be carried out by the following procedures in addition to the procedures described above.

(a) A liquid adhesive is coated directly onto the side of the conductive layer 12 in the conductive film 10 and dried to form the adhesive layer 21, followed by adhering the first releasing base material 22.

(b) A liquid adhesive is coated onto one side of the first releasing base material 22 and dried to form the adhesive layer 21, followed by adhering the side of the conductive layer 12 of the conductive film 10 thereto.

There are no particular limitations on the base material or releasing base material combined with the conductive layer and adhesive layer, and each layer may be coated directly onto other members used instead of the aforementioned base materials, such as a polarizing plate used in liquid crystal modules.

In order to improve coatability of the conductive layer and adhesive layer, the coating solution may be diluted with solvent as necessary. Examples of solvents include alcohols (such as methanol, ethanol or propanol), ketones (such as acetone or methyl ethyl ketone), and ethers (such as diethyl ether, methyl cellosolve or ethyl cellosolve).

Examples of coaters used for coating include a blade coater, air knife coater, roll coater, bar coater, gravure coater, rod and blade coater, lip coater, die coater, curtain coater and printing machines.

Drying is carried out with a hot forced air dryer or vacuum dryer and the like.

In addition, instead of forming the adhesive layer with a liquid adhesive, double-sided adhesive tape may also be used. Double-sided adhesive tape is provided with an adhesive layer between a pair of releasing sheets. Some adhesive layers contain a base material while other are composed of adhesive only. Furthermore, there are no particular limitations on this base material or adhesive sheet, known materials can be used, and examples thereof include paper and film. The releasing sheets are preferably single-sided releasing sheets having a releasing layer on one side.

In addition, the peel strength of one of the releasing sheets with respect to the adhesive layer is preferably different from the peel strength of the other releasing sheet with respect to the adhesive layer. This facilitates release of one of the releasing sheets prior to release of the other releasing sheet.

Although the cutting or stamping step (4) is carried out after laminating each of the sheet members that compose the conductive laminate 1, this may be carried out prior to lamination corresponding to the required form of the members.

[Touch Panel]

Although the conductive laminate of the present invention can be used as a constituent member of various types of touch panels, it is particularly preferable as an essential member of a projective touch panel of an electrostatic capacitive type in which a transparent conductive layer patterned in a form having regularity in a uniaxial direction is arranged on both sides of an insulating layer by making the patterns of the conductive layer to be intersecting perpendicularly. Touch panels employing this method have a configuration in which conductive layers located on both sides of an insulating layer are laminated to other members with adhesive. Although examples of the insulating layer include various types of sheet base materials and adhesive layers, there are no particular limitations thereon, and for example, the insulating layer consists of a sheet base material, adhesive layer and sheet base material in that order in the case of laminating the base material sides of two conductive films having a conductive layer on one side thereof with an adhesive. Consequently, use of the conductive laminate of the present invention makes it possible to manufacture a touch panel that not only easily inhibits changes in performance even in harsh environments subjected to high temperature or high humidity and the like, but also has superior shock resistance and is free of the occurrence of whitening phenomenon during sudden changes in temperature and humidity. Although a projective touch panel 100 of an electrostatic capacitive type according to an embodiment of the present invention is shown in FIG. 4, since touch panel configuration varies considerably for each manufacturer and type, the configuration is not limited thereto.

Figure 4:
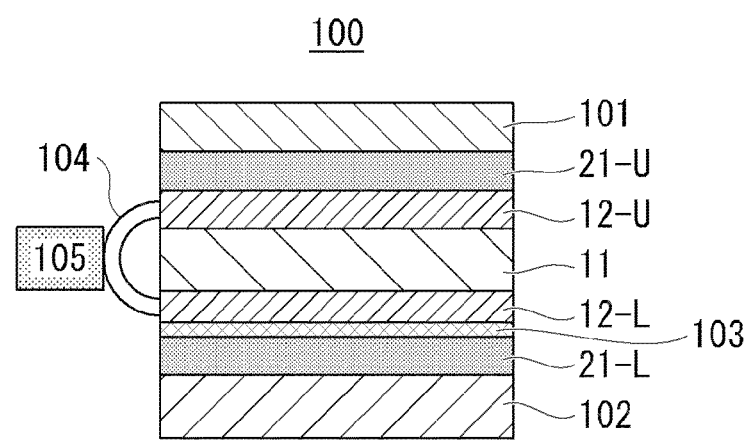
FIG. 4 is a cross-sectional view of an electrostatic capacitive touch panel.

In the configuration shown in FIG. 4, conductive layers 12-U (upper electrode) and 12-L (lower electrode), which have been patterned into a form having regularity in the uniaxial direction, are arranged on both sides of the base material 11 so that the patterns of the conductive layers intersect perpendicularly, and adhesive layers 21-U and 21-L are laminated on both sides thereof so as to be in direct contact with the conductive layers. Moreover, a covering base material 101 is laminated on one of the outsides thereof, while the polarizing plate side of a liquid crystal module 102 is laminated on the other side. Furthermore, the conductive layers are connected to an extracting electrode layer 103 and an FPC connector 104. Moreover, the conductive layers are electrically connected to an electrostatic capacitance detection circuit 105 with a flexible printed circuit board (abbreviated as FPC) and the like to complete the touch panel 100.

EXAMPLES

Although the following provides a more detailed explanation of the present invention by listing examples thereof, the present invention is naturally not limited thereto. Furthermore, the term "%" used in the examples indicates percent by weight unless specifically indicated otherwise.

Example 1

Production of Conductive Film

An aqueous dispersion containing a conductive substance obtained by polymerizing 3,4-ethylenedioxythiophene in the presence of polystyrene sulfonate (abbreviated as PEDOT-PSS) was mixed with a binder component in the form polyester resin (Vylonal MD1200, Toyobo Co., Ltd.) and a fluorine-based surfactant (Megafac F-556, DIC Corp.) at a ratio of 1:1:1 as the solid fraction, followed by diluting with methanol to obtain a mixture A having a solid concentration of 1%. This dispersion was then mixed with a 1% solution of a silane coupling agent (KBM-403, Shin-Etsu Silicone Co., Ltd.), obtained by diluting with a 50/50 mixture of water and methanol, at a weight ratio of 100:30 to prepare a conductive coating agent A. This conductive coating agent A was coated onto one side of a first base material in the form of a biaxially oriented polyethylene terephthalate film provided with a surface-treated highly adhesive layer on both sides thereof (trade name: Cosmoshine A4300, Toyobo Co., Ltd., thickness: 100 μm) to a dry thickness of about 0.2 μm with a bar coater followed by drying to obtain a conductive film 1 having surface resistivity of 287 Ω/sq (as determined in compliance with JIS-K 7194) and total luminous transmittance of 88.3% (as determined in compliance with JIS-K 7105).

Next, a conductive layer was also similarly formed on the other side to obtain a double-sided conductive film 1 for use in touch panel evaluation.

(Production of Adhesive Sheet)

<Preparation of Adhesive Containing Acidic Component>

After sealing nitrogen gas in a reaction apparatus equipped with a stirrer, thermometer, reflux condenser, dropping device and nitrogen inlet tube, solvents consisting of ethyl acetate and acetone were added. Next, monomer components consisting of 80 parts of ethylhexyl acrylate, 20 parts of methyl acrylate and 2 parts of acrylic acid and 0.08 parts of a polymerization initiator in the form of benzoyl peroxide were added to the reaction apparatus followed by polymerizing for 8 hours at the solvent reflux temperature in flowing nitrogen gas while stirring. Following completion of the polymerization reaction, toluene was added to obtain an acrylic polymer.

Next, 0.08 parts of 4,6-bis(octylthiomethyl)-o-cresol (trade name: Irganox 1520L, Ciba Specialty Chemicals Corp.) were added to the acrylic polymer to obtain a primary adhesive, followed by mixing 0.2 parts of a crosslinking adhesive in the form of tertiary amine group-containing epoxy resin to 100 parts as solid of the primary adhesive to obtain an adhesive A.

<Production of Adhesive Sheet>

The aforementioned adhesive was coated onto a PET releasing film having a thickness of 38 μm used as a first releasing base material (trade name: 38RL07(5), Oji Specialty Paper Co., Ltd.) so that the coated amount of the adhesive after drying was 175 g/m², followed by drying for 5 minutes at 100° C. to form an adhesive layer on the PET releasing film serving as the first releasing base material. Next, a PET releasing film, having a thickness of 38 μm and subjected to mold release treatment set so that peel strength was less than that of the first releasing base material (trade name: 38RL07(2), Oji Specialty Paper Co., Ltd.) was laminated onto the surface of the adhesive layer to serve as a second releasing base material, followed by allowing to stand for 1 week at room temperature to obtain an adhesive sheet A composed of a layer composition consisting of a first releasing base material, an adhesive layer and a second releasing base material.

(Production of Conductive Laminate)

Figure 5:
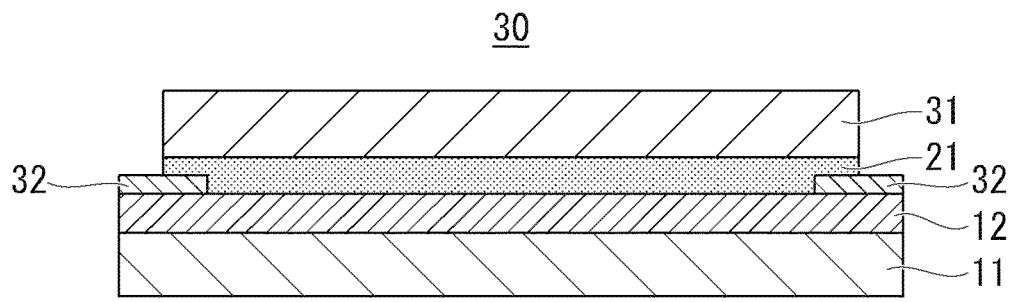
FIG. 5 is a cross-sectional view of a conductive laminate manufactured based on examples and comparative examples of the present invention.
Figure 6:
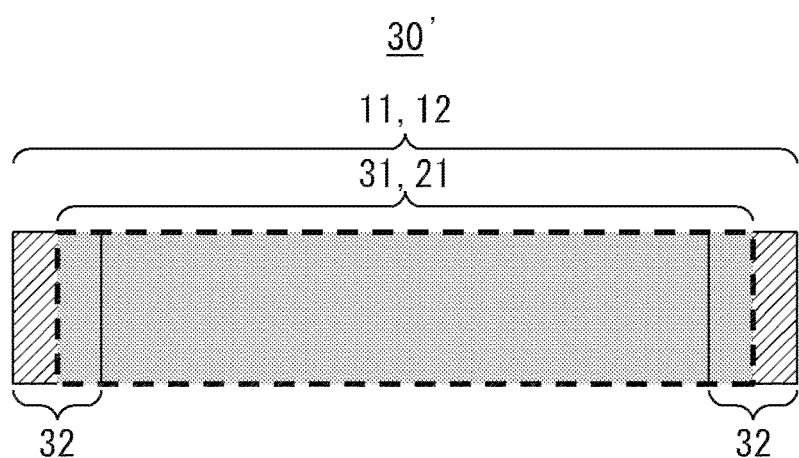
FIG. 6 is an overhead view of a conductive laminate manufactured based on examples and comparative examples of the present invention.

The second releasing base material of adhesive sheet A was peeled off, the adhesive surface thereof was affixed to the surface of the second base material composed of the same PET film as the first base material, and the resulting laminate was cut to a size of 2 cm×9 cm. Next, an extracting electrode was formed on both ends of the conductive film 1 cut to a size of 2 cm×10 cm with silver paste (Dotite FA-401CA, Fujikura Kasei Co., Ltd.). Moreover, the adhesive surface of the adhesive sheet A from which the first releasing base material had been peeled off was affixed to the surface thereof followed by carrying out autoclaving treatment for 30 minutes under conditions of 50° C. and 0.8 Pa to obtain a conductive laminate 1 of Example 1 composed of a layer composition consisting of a first base material, a conductive layer, an adhesive layer and a second base material. A cross-sectional view of the resulting conductive laminate 1 is shown in FIG. 5, while an overhead view is shown in FIG. 6.

<Production of Liquid Crystal Module with Touch Panel>

A photoresist dry film was affixed to the conductive layer of the double-sided conductive film 1, a quartz mask was superimposed thereon, and both sides were subjected to treatment consisting of irradiating each side with ultraviolet light at an exposure dose of 300 mJ/cm² with a metal halide lamp (Ultraviolet Curing Multi-Metal Lamp M03-L31, Eye Graphics Co., Ltd.). The quartz mask was patterned in a shape such that the X and Y electrode patterns were arranged so as to intersect perpendicularly on both sides of the first base material to enable detection of location when used as a touch panel sensor. Since the ultraviolet exposure dose used here was such that the dosage of ultraviolet light that reached the coated surface on the opposite side of the first base material by passing there through is extremely low, the pattern on the opposite side was not transferred to the back. Continuing, after removing a portion of the conductive layer together with uncured resist using an etching solution for use with organic polymer-type conductive layers, the remainder of the resist film was peeled off to obtain a double-sided, patterned conductive film 1.

(Production of Liquid Crystal Module with Touch Panel)

After forming extracting electrodes around the periphery of the double-sided, patterned conductive film 1 using the silver paste described above, the electrodes were connected to an FPC connector. Continuing, the polarizing plate side of a liquid crystal module was affixed to one side while a covering member in the form of optical glass having a thickness of 1 mm was affixed to the other side with the two adhesive sheets A interposed there between to produce a liquid crystal module 1 provided with a touch panel having the same configuration as that shown in FIG. 1.

Example 2

A double-sided conductive film 2 having a total luminous transmittance of 88.6% was produced by adjusting the thickness of the conductive layer so as to obtain surface resistivity of 287 Ω/sq in the same manner as Example 1 with the exception of using a silicone-based surfactant (Leveling Agent KP-110, Shin-Etsu Silicone Co., Ltd.) as a conductive coating agent B instead of the fluorine-based surfactant, and a conductive laminate 2 and a liquid crystal module 2 provided with a touch panel were produced using this double-sided conductive film 2.

Example 3

A double-sided conductive film 3 having a total luminous transmittance of 88.0% was produced by adjusting the thickness of the conductive layer so as to obtain surface resistivity of 287 Ω/sq in the same manner as Example 2 with the exception of mixing a mixture B, a 1% solution obtained by diluting a silane coupling agent (KBM-403, Shin-Etsu Silicone Co., Ltd.) with methanol, and a 1% solution obtained by diluting a melamine-based crosslinking agent (Sumimarl M-50W, Sumitomo Chemical Co., Ltd.) with methanol, at ratio of 100:15:15 for use as a conductive coating agent C, and a conductive laminate 3 and a liquid crystal module 3 provided with a touch panel were produced using this double-sided conductive film 3.

Example 4

After coating a hard coating agent (Aicatron Z711, Aica Inc., solid concentration: 40%) onto both sides of a biaxially oriented polyethylene terephthalate film provided with a surface-treated highly adhesive layer on both sides thereof (trade name: Lumilar U48, Toray Industries, Inc., thickness: 50 μm) to a dry thickness of 4 μm with a bar coater, the coated film was dried with hot air at 80° C. to form a hard coating layer by irradiating with ultraviolet light at 300 mJ/cm$^2$.

A conductive film 4 and a double-sided conductive film 4 having surface resistivity of 287 Ω/sq and total luminous transmittance of 89.2% were produced in the same manner as Example 2 with the exception of using this hard coating layer for the first base material of the conductive film, and these were then used to obtain a conductive laminate 4 and a liquid crystal module 4 provided with a touch panel.

Example 5

A conductive film 5 and a double-sided conductive film 5 having surface resistivity of 287 Ω/sq and total luminous transmittance of 89.1% were produced in the same manner as Example 1 with the exception of using a polycarbonate film (trade name: R40-#140, Kaneka Corp., thickness: 40 μm) for the first base material and using a mixture of Denatron PT-200MF (Nagase Chemtex Corp., ratio of primary agent to crosslinking agent to diluent=100:2:51) as a conductive coating agent D, and these were then used to obtain a conductive laminate 5 and a liquid crystal module 5 provided with a touch panel.

Example 6

A conductive film 6 and a double-sided conductive film 6 having surface resistivity of 287 Ω/sq and total luminous transmittance of 88.8% were produced in the same manner as Example 2 with the exception of using a cycloolefin polymer film (trade name: Zeonor ZF14, Zeon Corp., thickness: 100 μm) for the first base material, and these were then used to obtain a conductive laminate 6 and a liquid crystal module 6 provided with a touch panel.

Example 7

A conductive film 7 and a double-sided conductive film 7 having surface resistivity of 287 Ω/sq and total luminous transmittance of 89.1% were produced in the same manner as Example 4 with the exception of using a film provided with a hard coating layer on both sides of a biaxially oriented polyethylene terephthalate film provided with a surface-treated highly adhesive layer on both sides thereof (trade name: Lumilar U46, Toray Industries, Inc., thickness: 188 μm) for the first base material, and these were then used to obtain a conductive laminate 7.

A liquid crystal module 7 provided with a touch panel was obtained in the same manner as Example 1 with the exception of patterning the conductive layers on both sides of a double-sided conductive film 7 by laser processing instead of by etching.

Example 8

An adhesive sheet B was produced using an adhesive B synthesized in the same manner as Example 1 with the exception of using butyl acrylate instead of ethylhexyl acrylate and using styrene sulfonate instead of acrylic acid, and the conductive film 7 and double-sided conductive film 7 of Example 7 were combined to obtain a conductive laminate 8 and a liquid crystal module 8 provided with a touch panel.

Example 9

A conductive film 9 and a double-sided conductive film 9 having total luminous transmittance of 90.7% were produced in the same manner as Example 7 with the exception of adjusting the thickness of the conductive layer to surface resistivity of 450 Ω/sq, and these were then used to obtain a conductive laminate 9 and a liquid crystal module 9 provided with a touch panel.

Example 10

An adhesive sheet C was produced using an adhesive C synthesized in the same manner as Example 1 with the exception of using vinyl phosphate instead of acrylic acid, and the conductive film 9 and double-sided conductive film 9 of Example 9 were combined to obtain a conductive laminate 10 and a liquid crystal module 10 provided with a touch panel.

Example 11

Conductive glass having surface resistivity of 450 Ω/sq and total luminous transmittance of 87.9% was produced in the same manner as Example 1 with the exception of using an optical reinforced glass plate having a thickness of 1 mm for the first base material, and forming a conductive layer by solid printing using a conductive ink E containing PEDOT-PSS by screen printing, and a conductive laminate 11 was obtained using this instead of a conductive film.

Continuing, a double-sided, patterned conductive layer was produced by pattern printing the aforementioned conductive ink E onto both sides of the first base material by screen printing instead of patterning by etching the conductive layer. A liquid crystal module 11 provided with a touch panel was then obtained in the same manner as Example 1 with the exception of using this double-sided, pattern conductive layer.

Example 12

A conductive film 12 and a double-sided, patterned conductive film 12 having surface resistivity of 450 Ω/sq and total luminous transmittance of 88.2% were produced in the same manner as Example 11 with the exception of printing a conductive ink F containing PEDOT-PSS onto the same first base material as Example 7 by gravure offset printing instead of by screen printing, and a conductive laminate 12 and a liquid crystal module 12 provided with a touch panel were obtained in the same manner as Example 1 with the exception of using these conductive films 12.

Example 13

A conductive film 13 having surface resistivity of 450 Ω/sq and total luminous transmittance of 88.1% was produced by coating OJE-1 (Arakawa Chemical Industries, Ltd.) onto the same first base material as Example 7 as an ultraviolet-curable conductive coating agent G containing a conductive substance in the form of PEDOT-PSS, drying the coated base material, and irradiating with ultraviolet light at an exposure dose of 500 mJ/cm$^2$, and a conductive laminate 13 was obtained in the same manner as Example 1 with the exception of using conductive film 13.

<Production of Liquid Crystal Module with Touch Panel>

A double-sided, patterned conductive film 13 was produced in the same manner as Example 1 with the exception of coating OJE-1 on both sides of the same first base material with a bar coater, followed by drying, superimposing a quartz mask, irradiating with ultraviolet light at an exposure dose of 500 mJ/cm$^2$ and rinsing with water, and this was then used to obtain a liquid crystal module 13 provided with a touch panel.

Example 14

Production of Anchor Layer

An anchor layer coating material A, obtained by mixing Takenate D-110N (Mitsui Chemicals Polyurethanes Inc.) (1 part) and Mowital B60HH (Kuraray Co., Ltd.) (9 parts) and diluting to a non-volatile component content of 9.0% by weight with 2-butanone (methyl ethyl ketone), was coated onto both sides of the biaxially oriented polyethylene terephthalate film having a thickness of 188 μm and provided with a surface-treated highly adhesive layer used in Example 7 to a dry weight of 0.7 g/m$^2$ with a bar coater followed by drying (1 minute at 130° C.) to form an anchor layer.

(Production of Foam Releasing Layer)

The composition of a foam releasing layer was obtained by mixing a copolymer (100 parts by weight) of degradable compounds in the form of tert-butyl methacrylate (38 mol %), methyl methacrylate (36 mol %), 2-hydroxyethyl methacrylate (20 mol %) and n-butyl methacrylate (6 mol %) with an acid generator in the form of an oniom salt-based acid generator consisting of 2-[2,2,3,3,4,4,5,5-octafluoro-1-(nonafluorobutyl-sulfonyloxyimino)-pentyl]-fluorene (CGI-1907, Ciba Japan K.K.) (0.5 parts), followed by diluting with ethyl acetate to obtain a foam releasing layer coating material having a non-volatile component content of 25.0% by weight. Next, the foam releasing layer coating material was coated onto the surfaces (both sides) of an anchor layer formed on a base material using an applicable bar having a gap of 160 μm (doctor blade, Yoshimitsu Seiki Co., Ltd.) to a dry weight of 20 g/m$^2$ followed by drying (8 minutes at 105° C.) to obtain a base material for patterning.

(Production of Conductive Layer)

A conductive film 14 and a double-sided conductive film 14 having surface resistivity of 450 Ω/sq and total luminous transmittance of 88.1% were produced by forming a conductive layer with a bar coater in the same manner as Example 2 with the exception of using this base material for patterning for the first base material to obtain a conductive laminate 14.

<Production of Liquid Crystal Module with Touch Panel>

(Releasing Adhesive Film Lamination Step)

The releasing adhesive film used was produced according to the method described below. A PET film G2 manufactured by Teijin Dupont Films Japan, Ltd. (thickness: 75 μm) was used as a support. Adhesive components consisting of 100 parts by weight of a primary agent in the form of SH101 (Toyo Ink Co., Ltd., 60%) and 2 parts by weight of a curing agent in the form of BXX6105 (Toyo Ink Co., Ltd., 37.5%) were mixed to obtain a releasing adhesive. Next, the releasing adhesive was coated onto the PET film G2 using the aforementioned applicator having a gap of 100 μm followed by drying (2 minutes at 100° C.) and allowing to stand for 1 week at room temperature to obtain a releasing adhesive film. The thickness of the releasing adhesive layer was 12 μm. The produced adhesive film was laminated onto the surfaces (both sides) of the aforementioned conductive layer using a laminator.

(Ultraviolet Irradiation Step)

A mask pattern was exposed to ultraviolet light by irradiating at 300 mJ/cm$^2$ using a vacuum exposure system while adhering to the side of the base material of the adhesive film.

(Heating Step)

Continuing, the aforementioned sheet was subjected to heat treatment for 2 minutes in a constant temperature dryer at 130° C. Only the foam releasing layer of the irradiated pattern foamed and peeled off easily.

(Adhesive Film Removal Step)

Treatment enabling the releasing adhesive film to peel from the produced laminate and only the portion caused by foam by ultraviolet irradiation to peel for each conductive layer was carried out on both sides to obtain a double-sided, patterned conductive film 14. A liquid crystal module 14 provided with a touch panel was then produced in the same manner as Example 1 with the exception of using this double-sided, patterned conductive film 14.

Comparative Example 1

Preparation of Adhesive Not Containing Acidic Component

After sealing nitrogen gas in a reaction apparatus equipped with a stirrer, thermometer, reflux condenser, dropping device and nitrogen inlet tube, solvents consisting of ethyl acetate and acetone were added. Next, monomer components consisting of 78 parts of 2-methoxyethyl acrylate, 20 parts of ethylhexyl acrylate, 2 parts of 4-hydroxybutyl acrylate and 0.2 parts of a polymerization initiator in the form of 2,2-azobisisobutyronitrile were added to the reaction apparatus followed by polymerizing for 8 hours at 65° C. in flowing nitrogen gas while stirring. Following completion of the polymerization reaction, toluene was added to obtain an adhesive D.

A conductive laminate 15 and a liquid crystal module 15 provided with a touch panel were produced in the same manner as Example 2 with the exception of using an adhesive sheet D obtained from the adhesive D instead of the adhesive sheet A.

Comparative Example 2

A conductive laminate 16 was produced in the same manner as Example 1 with the exception of using a PET film having a thickness of 175 μm instead of the conductive film 1, and using an ITO film having surface resistivity of 450 Ω/sq and total luminous transmittance of 89.2% on which an amorphous ITO layer was formed by sputtering.

In addition, a double-sided, patterned conductive film 16 was produced in the same manner as Example 1 with the exception of patterning a double-sided ITO film having an ITO layer on both sides in the same manner as described above using an ITO etching solution, and this was used to produce a liquid crystal module 16 provided with a touch panel.

Comparative Example 3

A conductive laminate 17 and a liquid crystal module 17 provided with a touch panel were produced in the same manner as Comparative Example 2 with the exception of using the adhesive sheet D used in Comparative Example 1 instead of the adhesive sheet A.

Comparative Example 4

A conductive laminate 18 was produced in the same manner as Comparative Example 3 with the exception of using a PET film having a thickness of 125 μm instead of the ITO film 1, and using an ITO film 2 having surface resistivity of 274 Ω/sq and total luminous transmittance of 88.1% on which an amorphous ITO layer was formed by sputtering.

In addition, a double-sided, patterned conductive film 18 was produced in the same manner as Comparative Example 3 with the exception of using a double-sided ITO film 2 having an ITO layer on both sides in the same manner as previously described, and this was used to produce a liquid crystal module 18 provided with a touch panel.

Comparative Example 5

A conductive laminate 19 was produced in the same manner as Comparative Example 3 with the exception of using a PET film having a thickness of 50 μm instead of the ITO film 1, and using an ITO film 3 having surface resistivity of 306 Ω/sq and total luminous transmittance of 89.3% that was crystallized by subjecting to heat treatment for 1 hour at 150° C. and on which an ITO layer was formed by sputtering.

In addition, a double-sided, patterned conductive film 19 and a liquid crystal module 19 provided with a touch panel were produced in the same manner as Comparative Example 3 with the exception of using a double-sided ITO film 3 having an ITO layer on both sides in the same manner as previously described.

Comparative Example 6

A conductive laminate 20 and a liquid crystal module 20 provided with a touch panel were produced in the same manner as Comparative Example 1 with the exception of using the conductive film 12 and double-sided, patterned conductive film used in Example 12.

(Evaluation Methods)

Each of the conductive laminates and liquid crystal modules provided with touch panels obtained in Examples 1 to 14 and Comparative Examples 1 to 6 were evaluated for quality using the methods described below.

(Evaluation of Conductive Laminate Durability)

Two sets of three test pieces each of the conductive laminates were produced, and resistance between electrodes formed on both ends of each test piece was measured with an ohmmeter in a normal temperature, normal humidity environment (23° C., 50% RH). Next, one set of test pieces was left in the normal temperature, normal humidity environment (23° C., 50% RH), and the other set was transferred to a high temperature, high humidity environment (85° C., 80% RH) and allowed to stand in order to carry out a durability test. After 250 hours, the test pieces transferred to the high temperature, high humidity environment were returned to the normal temperature, normal humidity environment followed by observation of their appearance. After humidifying for 2 hours under these conditions, the resistance values of the test pieces were measured and evaluated according to the following criteria.

[Observation of Appearance]

A: Hardly any change, favorable appearance

B: Although test piece whitened somewhat after transferring from high temperature, high humidity environment to normal temperature, normal humidity environment, whitening became inconspicuous within 30 minutes C: Test piece whitened after transferring from high temperature, high humidity environment to normal temperature, normal humidity environment, and the clouded state persisted for several hours.

[Changes in Resistance Values]

A: Change in electrical resistance before and after durability test extremely favorable at less than 10%

B: Change in electrical resistance before and after durability test favorable at 10% to less than 20%

C: Change in electrical resistance before and after durability test 20% to less than 100%

D: Change in electrical resistance before and after durability test unsuitable at 100% or more (Evaluation of Conductive Laminate Bendability)

Figure 7:
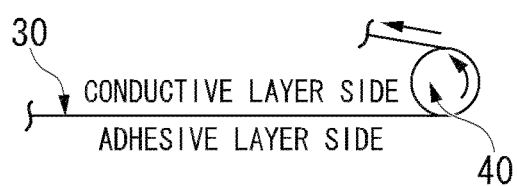
FIG. 7 is a drawing showing a method for evaluating bendability of a conductive laminate manufactured on the basis of examples and comparative examples of the present invention.

One set of three test pieces each of the conductive laminates were produced, and resistance between electrodes formed on both ends of each test piece was measured with an ohmmeter in a normal temperature, normal humidity environment (23° C., 50% RH). Next, a bendability test was carried out by employing a procedure consisting of repeatedly bending the test pieces around a cylinder having a diameter of 5 mm as shown in FIG. 7 20 times in each direction, followed by observing the appearance of the test pieces and measuring the resistance values thereof. Fluctuations in resistance values were evaluated according to the criteria indicated below.

[Observation of Appearance]

A: No change, favorable appearance

B: Slight damage to a portion of the laminate surface

C: Separation marks observed over a portion or all of the laminate, unsuitable appearance

[Changes in Resistance Values]

A: Change in electrical resistance before and after durability test favorable at less than 10%

B: Change in electrical resistance before and after durability test at 10% to less than 100%

C: Change in electrical resistance before and after durability test unsuitable at 100% or more (Evaluation of Use as Touch Panel)

The touch panels obtained in Examples 1 to 14 and Comparative Examples 1 to 6 were held for 250 hours in two types of environments consisting of a normal temperature, normal humidity environment (23° C., 50% RH) and high temperature, high humidity environment (85° C., 80% RH), followed by confirming operation in the normal temperature, normal humidity environment and evaluating according to the criteria indicated below. The evaluation results are shown in Table 2.

[Responsiveness]

A: Touch panel held in high temperature, high humidity environment demonstrated favorable responsiveness similar to that held in normal temperature, normal humidity environment B: Touch panel held in high temperature, high humidity environment did not demonstrate deterioration of responsiveness, but demonstrated a slight error in detected location C: Touch panel held in high temperature, high humidity environment was confirmed to demonstrate poor performance in the form of inferior responsiveness and error in detected location in comparison with that held in normal temperature, normal humidity environment

[Visibility]

A: Favorable visibility with no clouding

B: Some decrease in visibility due to clouding when transferred to normal temperature, normal humidity environment after holding in high temperature, high humidity environment C: Decreased visibility due to clouding when transferred to normal temperature, normal humidity environment after holding in high temperature, high humidity environment The production conditions of the examples and comparative examples are shown in Table 1, and evaluation results are shown in Table 2.

TABLE 1

| | | Conductive Film | | |
|---|---|---|---|---|
| | Base Material | Conductive Layer Material | Patterning Method | Adhesive Sheet Adhesive |
| Ex. 1 | 100 mm PET film | PEDOT coating agent A | Etching | Adhesive A |
| Ex. 2 | 100 mm PET film | PEDOT coating agent B | Etching | Adhesive A |
| Ex. 3 | 100 mm PET film | PEDOT coating agent C | Etching | Adhesive A |
| Ex. 4 | 50 mm PET film (+double-sided HC layer) | PEDOT coating agent B | Etching | Adhesive A |
| Ex. 5 | 40 mm PC film | PEDOT coating agent D | Etching | Adhesive A |
| Ex. 6 | 100 mm COP film | PEDOT coating agent B | Etching | Adhesive A |
| Ex. 7 | 188 mm PET film (+double-sided HC layer) | PEDOT coating agent B | Laser patterning | Adhesive A |
| Ex. 8 | 188 mm PET film (+double-sided HC layer) | PEDOT coating agent B | Etching | Adhesive B |
| Ex. 9 | 188 mm PET film (+double-sided HC layer) | PEDOT coating agent B | Etching | Adhesive A |
| Ex. 10 | 188 mm PET film (+double-sided HC layer) | PEDOT coating agent B | Etching | Adhesive C |
| Ex. 11 | 1 mm optical reinforced glass | PEDOT ink G | Screen printing | Adhesive A |
| Ex. 12 | 188 mm PET film (+double-sided HC layer) | PEDOT ink H | Gravure offset printing | Adhesive A |
| Ex. 13 | 188 mm PET film (+double-sided HC layer) | PEDOT coating agent B | UV curing + rinsing | Adhesive A |
| Ex. 14 | 188 mm PET film + anchor layer + foam releasing layer | PEDOT coating agent B | Foam release | Adhesive A |
| Comp. Ex. 1 | 100 mm PET film | PEDOT coating agent B | Etching | Adhesive D |
| Comp. Ex. 2 | 175 mm PET film | Amorphous ITO | Etching | Adhesive A |
| Comp. Ex. 3 | 175 mm PET film | Amorphous ITO | Etching | Adhesive D |
| Comp. Ex. 4 | 125 mm PET film | Amorphous ITO | Etching | Adhesive D |
| Comp. Ex. 5 | 50 mm PET film | Post-crystalline ITO | Etching | Adhesive D |
| Comp. Ex. 6 | 100 mm PET film | PEDOT ink H | Gravure offset printing | Adhesive D |

TABLE 2

| | Conductive Laminate | | | | | Touch Panel High temperature, high humidity test | |
|---|---|---|---|---|---|---|---|
| | [Durability] Appearance | [Durability] Changes in resistance (a) Normal temp./normal humidity | (b) High temp./high humidity | [Bendability] Changes in resistance | Appearance | Responsiveness | Visibility |
| Ex. 1 | A | A | B | A | A | A | A |
| Ex. 2 | A | A | A | A | A | A | A |
| Ex. 3 | A | A | B | A | A | A | A |
| Ex. 4 | A | A | A | A | A | A | A |
| Ex. 5 | A | A | A | A | A | A | A |
| Ex. 6 | A | A | A | A | A | A | A |
| Ex. 7 | A | A | A | A | A | A | A |
| Ex. 8 | A | A | B | A | A | A | A |
| Ex. 9 | A | A | A | A | A | A | A |
| Ex. 10 | A | A | B | A | A | A | A |
| Ex. 11 | A | A | B | A | B | A | A |
| Ex. 12 | A | A | B | A | B | A | A |
| Ex. 13 | A | A | B | A | A | A | A |
| Ex. 14 | A | A | B | A | A | A | A |
| Comp. Ex. 1 | A | B | C | B | B | A | B |
| Comp. Ex. 2 | B | B | D | C | A | C | B |

TABLE 2-continued

| | Conductive Laminate | | | | | Touch Panel High temperature, high humidity test | |
|---|---|---|---|---|---|---|---|
| | [Durability] Appearance | [Durability] Changes in resistance | | [Bendability] | | | |
| | | (a) Normal temp./normal humidity | (b) High temp./high humidity | Changes in resistance | Appearance | Respon- siveness | Visibility |
| Comp. Ex. 3 | C | B | C | C | C | B | C |
| Comp. Ex. 4 | C | B | C | C | C | B | C |
| Comp. Ex. 5 | C | B | C | C | C | A | C |
| Comp. Ex. 6 | A | B | C | B | B | B | B |

As shown in Table 1, in Examples 1 to 14 relating to laminates of a polythiophene-based conductive layer and an adhesive layer containing an acidic component of the present invention, conductive laminates were obtained that not only demonstrated little changes in resistance values, but also did not demonstrate whitening phenomenon during sudden changes in temperature and humidity, while also demonstrating favorable bendability. In addition, touch panels using these laminates as members thereof demonstrated favorable durability and visibility even in a high temperature, high humidity environment. In particular, conductive laminates containing an acrylic polymer having a carboxyl group for the acidic component of the adhesive layer demonstrated even more favorable stability in a harsh environment at high temperatures and high humidity in comparison with adhesive layers having a sulfonate group or phosphate group for the acidic component. The effects of the present were able to be confirmed on the basis of these findings.

In contrast, the combinations of non-thiophene-based conductive layers and adhesive layers differing from configuration of the present invention demonstrated considerable changes in resistance values in a durability test carried out in a high temperature, high humidity environment and were determined to be unsuitable. In particular, Comparative Example 2, which combined ITO with an adhesive layer containing an acrylic polymer having a carboxyl group as a monomer unit for the acidic component, for which favorable results were demonstrated in the examples, changes in resistance values in a high temperature, high humidity environment were remarkable, and deterioration of quality was prominent even in the case of using as a touch panel. On the other hand, combinations of ITO with an adhesive layer not containing an acidic component not only demonstrated changes in resistance values in a high temperature, high humidity environment, but also demonstrated poor visibility due to whitening phenomenon. Furthermore, in the case of combinations of a polythiophene-based conductive layer and an adhesive layer not containing an acidic component, although there were no fatal defects observed, they were not superior to the combinations of the present invention.

INDUSTRIAL APPLICABILITY

The present invention makes it possible to provide a conductive laminate that not only demonstrates little deterioration of performance even in harsh environments at high temperature and high humidity, but is also free of the occurrence of a whitening phenomenon occurring during sudden changes in temperature and humidity, while also being favorable for use as a constituent member of a touch panel having superior shock resistance.

BRIEF DESCRIPTION OF THE REFERENCE SYMBOLS

| | |
|---|---|
| 1, 30: | Conductive laminate |
| 10: | Conductive film |
| 11: | Base material |
| 12: | Conductive layer (uniform or arbitrarily patterned layer) |
| 20: | Adhesive sheet |
| 21: | Adhesive layer |
| 22: | Releasing first base material |
| 23: | Releasing second base material |
| 31: | Second base material |
| 32: | Silver electrode (extracting electrode) |
| 40: | Cylinder for evaluating bendability |
| 100: | Liquid crystal module with electrostatic capacitive-type touch panel |
| 101: | Covering member |
| 102: | Liquid crystal module |
| 103: | Extracting electrode wire |
| 104: | FPC connector |
| 105: | Electrostatic capacitance detection circuit |

What is claimed is:

1. A conductive laminate comprising:
a base material,
first and second conductive layers uniformly or arbitrarily patterned into a shape having uniaxial regularity laminated onto both sides of the base material so that the patterns of the conductive layers are mutually perpendicular,
a first adhesive layer provided in direct contact over the entire surface or a portion of the first conductive layer on the outer side of the first conductive layer;
a second adhesive layer provided in direct contact over the entire surface or a portion of the second conductive layer on the outer side of the second conductive layer,
a first extraction electrode in contact with both the first conductive layer and the first adhesive layer, wherein the first extraction electrode is sandwiched between the first conductive layer and the first adhesive layer,
a second extraction electrode in contact with both the second conductive layer and the second adhesive layer, wherein the second extraction electrode is sandwiched between the second conductive layer and the second adhesive layer,
wherein the first and the second conductive layers contain a polythiophene-based conductive agent, the first and the second extraction electrodes are formed from metal materials, and the first and the second adhesive layers contain an acidic component.

2. The conductive laminate according to claim 1, wherein the extraction electrode is formed by a silver paste.

3. The conductive laminate according to claim 1, wherein the adhesive layer contains an acrylic polymer having a carboxyl group or a derivative thereof.

4. The conductive laminate according to claim 1, wherein the adhesive layer contains a copolymer comprising a unit derived from one or both of butyl acrylate or ethylhexyl acrylate and a unit derived from acrylic acid.

5. The conductive laminate according to claim 1, wherein the polythiophene-based conductive agent comprises a polymer of one or both of 3-hexylthiophene or 3,4-ethylenedioxythiophene, or a derivative thereof.

6. A touch panel provided with the conductive laminate according to claim 1.

7. The touch panel according to claim 6, wherein said touch panel is of the electrostatic capacitive type.

* * * * *